(12) United States Patent
Yuasa et al.

(10) Patent No.: US 12,065,385 B2
(45) Date of Patent: Aug. 20, 2024

(54) CERAMIC-COPPER COMPOSITE, METHOD OF PRODUCING CERAMIC-COPPER COMPOSITE, CERAMIC CIRCUIT BOARD, AND POWER MODULE

(71) Applicant: DENKA COMPANY LIMITED, Tokyo (JP)

(72) Inventors: Akimasa Yuasa, Omuta (JP); Takahiro Nakamura, Omuta (JP); Shuhei Morita, Omuta (JP); Koji Nishimura, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 587 days.

(21) Appl. No.: 17/296,172

(22) PCT Filed: Nov. 22, 2019

(86) PCT No.: PCT/JP2019/045833
§ 371 (c)(1),
(2) Date: May 21, 2021

(87) PCT Pub. No.: WO2020/105734
PCT Pub. Date: May 28, 2020

(65) Prior Publication Data
US 2022/0009842 A1  Jan. 13, 2022

(30) Foreign Application Priority Data
Nov. 22, 2018 (JP) .................. 2018-218964

(51) Int. Cl.
B32B 7/12 (2006.01)
B32B 9/04 (2006.01)
(Continued)

(52) U.S. Cl.
CPC .............. *C04B 37/026* (2013.01); *B32B 7/12* (2013.01); *B32B 9/041* (2013.01); *B32B 15/20* (2013.01);
(Continued)

(58) Field of Classification Search
CPC ......... B32B 17/12; B32B 9/041; B32B 15/20; B32B 18/00; B32B 2457/08; C04B 2237/125; C04B 2237/407
(Continued)

(56) References Cited

U.S. PATENT DOCUMENTS 5,807,626 A   9/1998 Naba
6,613,450 B2  9/2003 Tsukaguchi et al.
(Continued)

FOREIGN PATENT DOCUMENTS

CN  1152371 A    6/1997
CN  103619779 A  3/2014
(Continued)

OTHER PUBLICATIONS

Dec. 17, 2021 Extended Search Report issued in European Patent Application No. 19887440.6.
(Continued)

*Primary Examiner* — Katherine A Christy
(74) *Attorney, Agent, or Firm* — Oliff PLC

(57) ABSTRACT

A ceramic-copper composite having a flat plate shape, including: a ceramic layer; a copper layer; and a brazing material layer present between the ceramic layer and the copper layer. When a region having a length of 1,700 μm in a long-side direction is a region P on a cut surface of the ceramic-copper composite obtained when the ceramic-copper composite is cut with a plane perpendicular to a main surface of the ceramic-copper composite, an average crystal grain size D1 of copper crystals at least partially present in
(Continued)

a region P1 within 50 μm on a side of the copper layer from an interface between the ceramic layer and the brazing material layer in the region P is 30 μm or more and 100 μm or less.

10 Claims, 3 Drawing Sheets

(51) Int. Cl.
*B32B 15/20* (2006.01)
*B32B 18/00* (2006.01)
*C04B 37/02* (2006.01)
*H05K 1/03* (2006.01)
*H05K 1/09* (2006.01)

(52) U.S. Cl.
CPC ........... *B32B 18/00* (2013.01); *H05K 1/0306* (2013.01); *H05K 1/09* (2013.01); *B32B 2250/40* (2013.01); *B32B 2457/08* (2013.01); *C04B 2237/125* (2013.01); *C04B 2237/407* (2013.01); *C04B 2237/60* (2013.01)

(58) Field of Classification Search
USPC ......................................................... 428/674
See application file for complete search history.

(56) References Cited

U.S. PATENT DOCUMENTS

| | | | |
|---|---|---|---|
| 9,872,380 | B2 | 1/2018 | Aono et al. |
| 10,016,956 | B2 | 7/2018 | Terasaki et al. |
| 10,485,112 | B2 | 11/2019 | Kishimoto |
| 2003/0068532 | A1 | 4/2003 | Tsukaguchi et al. |
| 2011/0079418 | A1 | 4/2011 | Furuichi et al. |
| 2014/0126155 | A1 | 5/2014 | Imamura et al. |
| 2016/0221305 | A1 | 8/2016 | Terasaki et al. |
| 2016/0358791 | A1 | 12/2016 | Terasaki et al. |
| 2017/0181272 | A1 | 6/2017 | Aono et al. |
| 2019/0150298 | A1 | 5/2019 | Kishimoto |

FOREIGN PATENT DOCUMENTS

| | | | |
|---|---|---|---|
| CN | 105452195 | A | 3/2016 |
| CN | 105980334 | A | 9/2016 |
| JP | 2003-112980 | A | 4/2003 |
| JP | 2005-112677 | A | 4/2005 |
| JP | 2005-268821 | A | 9/2005 |
| JP | 2006-282417 | A | 10/2006 |
| JP | 2011-124585 | A | 6/2011 |
| JP | 5129189 | B2 | 1/2013 |
| JP | 2014-090144 | A | 5/2014 |
| JP | 2015-092552 | A | 5/2015 |
| JP | 2016-169111 | A | 9/2016 |
| JP | 6415297 | B2 | 10/2018 |
| WO | 2016-017679 | A1 | 2/2016 |
| WO | 2017-213207 | A1 | 12/2017 |

OTHER PUBLICATIONS

May 16, 2022 Office Action issued in Chinese Patent Application No. 201980075826.5.
Jul. 26, 2022 Office Action issued in Japanese Patent Application No. 2020-557676.
Development of Oxygen-free Copper Strips "GOFC" With Superior Heat-resisting Properties, Japan, Nippon Expressway Electric MFG, No. 137, and pp. 61-62.
Feb. 4, 2020 International Search Report issued in International Patent Application No. PCT/JP2019/045833.
Nov. 7, 2022 Office Action issued in European Patent Application No. 19887440.6.

CERAMIC-COPPER COMPOSITE, METHOD OF PRODUCING CERAMIC-COPPER COMPOSITE, CERAMIC CIRCUIT BOARD, AND POWER MODULE

TECHNICAL FIELD

The present invention relates to a ceramic-copper composite, a method of producing the ceramic-copper composite, a ceramic circuit board, and a power module.

BACKGROUND ART

In manufacturing a power module, a ceramic-metal composite obtained by bonding a metal plate with a ceramic material such as alumina, beryllium, silicon nitride, or aluminum nitride has been used.

Recently, an amount of heat generated from the power module has been steadily increased in accordance with high power output or high integration of the power module. In order to efficiently dissipate the generated heat, a ceramic material such as an aluminum nitride sintered body or a silicon nitride sintered body having high insulation and high thermal conductivity tends to be used.

As an example, Patent Document 1 discloses a metal-ceramic bonded body including a ceramic substrate and a metal plate bonded onto the ceramic substrate through a brazing material. In the bonded body, a length of the brazing material protruding from a bottom surface of the metal plate is more than 30 μm and 250 μm or less.

As another example, Patent Document 2 discloses a ceramic circuit board in which a brazing material layer is formed on at least one surface of a ceramic substrate along a plurality of circuit patterns, a metal plate is bonded through the brazing material layer, and an etching treatment is performed on an unnecessary part of the metal plate to form a circuit pattern constituting the metal plate and to form a protruding portion by a brazing material layer protruded from an edge of the metal plate. In the ceramic circuit board, the maximum surface roughness Rmax of the protruding portion is 5 to 50 μm.

As still another example, Patent Document 3 discloses a Cu/ceramic bonded body in which a copper member made of copper or a copper alloy and a ceramic member made of AlN or $Al_2O_3$ are bonded using a bonding material containing Ag and Ti. In the bonded body, a Ti compound layer made of a Ti nitride or a Ti oxide is formed at a bonding interface between a copper member and a ceramic member, and Ag particles are dispersed in the Ti compound layer.

RELATED DOCUMENT

Patent Document

[Patent Document 1] Japanese Unexamined Patent Publication No. 2003-112980

[Patent Document 2] Japanese Unexamined Patent Publication No. 2005-268821

[Patent Document 3] Japanese Unexamined Patent Publication No. 2015-092552

SUMMARY OF THE INVENTION

Technical Problem

The ceramic material and the metal plate greatly differ in a coefficient of thermal expansion. Therefore, thermal stress caused by a difference in the coefficient of thermal expansion is generated at the bonding interface between the ceramic material and the metal plate, due to a load from the repeated thermal cycle. In addition, cracks may occur on a side of the ceramic material, resulting in bonding defects or poor thermal resistance, which may reduce reliability of the power module.

In particular, with the intention of mounting the power module in recent electric vehicles, higher power outputs and higher integration of the power module are rapidly progressing even further, and the thermal stress due to the thermal cycle tends to be further increased. Therefore, it is getting more important to deal with the thermal cycle load/thermal stress.

In order to ensure functional safety, automobile manufacturers have evaluated the durability of the power module by a thermal cycle test in which "cycles to increasing/decreasing the temperature by cooling at −40° C. for 15 minutes, keeping at room temperature for 15 minutes, heating at 125° C. for 15 minutes, and keeping at room temperature for 15 minutes are set as one cycle" in the related art.

However, it has been changed recently to evaluate the durability of the power module by a stricter thermal cycle test in which "cycles to increasing/decreasing the temperature by cooling at −55° C. for 15 minutes, keeping at room temperature for 15 minutes, heating at 175° C. for 15 minutes, and keeping at room temperature for 15 minutes are set as one cycle".

In particular, when the cooling temperature is lowered (−40° C.→−55° C.), the stress generated in the ceramic material increases, and cracks are likely to occur.

Under such stricter thermal cycle test conditions, the conventional ceramic-metal composite (for example, the ceramic-metal composite described in the above-mentioned Patent Documents) cannot obtain sufficient effects such as stress relaxation/crack reduction.

The present invention has been made in view of such circumstances. An object of the present invention is to provide a ceramic-metal composite (substrate including a ceramic layer and a metal layer) in which cracks are less likely to occur even through the thermal cycle test with the strict conditions.

Solution to Problem

As a result of extensive studies, the present inventors have completed the inventions provided below and solved the above problems.

The present invention is as follows.

1. A ceramic-copper composite having a flat plate shape, including: a ceramic layer; a copper layer; and a brazing material layer present between the ceramic layer and the copper layer, in which when a region having a length of 1,700 μm in a long-side direction is a region P on a cut surface of the ceramic-copper composite obtained when the ceramic-copper composite is cut at a plane perpendicular to a main surface of the ceramic-copper composite, an average crystal grain size D1 of copper crystals at least partially present in a region P1 within 50 μm on a side of the copper layer from an interface between the ceramic layer and the brazing material layer in the region P is 30 μm or more and 100 μm or less.

2. The ceramic-copper composite according to 1., in which when an average crystal grain size of copper crystals in the entire region P is D2, a value of D2/D1 is 0.5 or more and 2.0 or less.

3. The ceramic-copper composite according to 1. or 2., in which the copper crystals at least partially present in the region P1 do not contain crystals having a grain size of exceeding 350 μm.

4. The ceramic-copper composite according to any one of 1. to 3., in which when a region having a length of 1,700 μm in a long-side direction and different from the region P in the cut surface is a region P', an average crystal grain size D1' of copper crystals at least partially present in a region P1' within 50 μm on the side of the copper layer from the interface between the ceramic layer and the brazing material layer in the region P' is 30 μm or more and 100 μm or less.

5. The ceramic-copper composite according to 4., in which copper crystals at least partially present in the region P1' do not contain the crystals having the grain size of exceeding 350 μm.

6. The ceramic-copper composite according to any one of 1. to 5., in which the copper layer is formed of a rolled copper plate.

7. The ceramic-copper composite according to any one of 1. to 6., in which the brazing material layer includes Ag, Cu and Ti, and Sn and/or In.

8. A method of the ceramic-copper composite according to any one of 1. to 7., the method including: bonding a ceramic plate and a copper plate with a brazing material by heating at a temperature of 770° C. or higher and 830° C. or lower for 10 minutes or longer and 60 minutes or shorter in vacuum or inert gas atmosphere, in which the brazing material contains 85.0 parts by mass or more and 95.0 parts by mass or less of Ag, 5.0 parts by mass or more and 13.0 parts by mass or less of Cu, 1.5 parts by mass or more and 5.0 parts by mass or less of Ti, and 0.4 parts by mass or more and 3.5 parts by mass or less a total amount of Sn and In.

9. A ceramic circuit board in which a circuit of the ceramic-copper composite according to any one of 1. to 7. from which at least a part of the copper layer is removed is formed.

10. A power module on which the ceramic circuit board according to 9. is mounted.

Advantageous Effects of Invention

According to the present invention, it is possible to provide a ceramic-metal composite (substrate including a ceramic layer and a metal layer) in which cracks are less likely to occur even through the thermal cycle test with the strict conditions.

BRIEF DESCRIPTION OF THE DRAWINGS

The above-described and other objects, advantages, and features of the present invention will be more apparent from the preferred embodiments described below, and the accompanying drawings.

FIG. 1 is a diagram schematically illustrating a ceramic-copper composite of the present embodiment.

DESCRIPTION OF EMBODIMENTS

Hereinafter, an embodiment of the present invention will be described in detail with reference to the drawings.

In all drawings, the same constituent components are denoted by the same reference signs, and detailed explanation thereof will not be repeated.

Figure 1A:
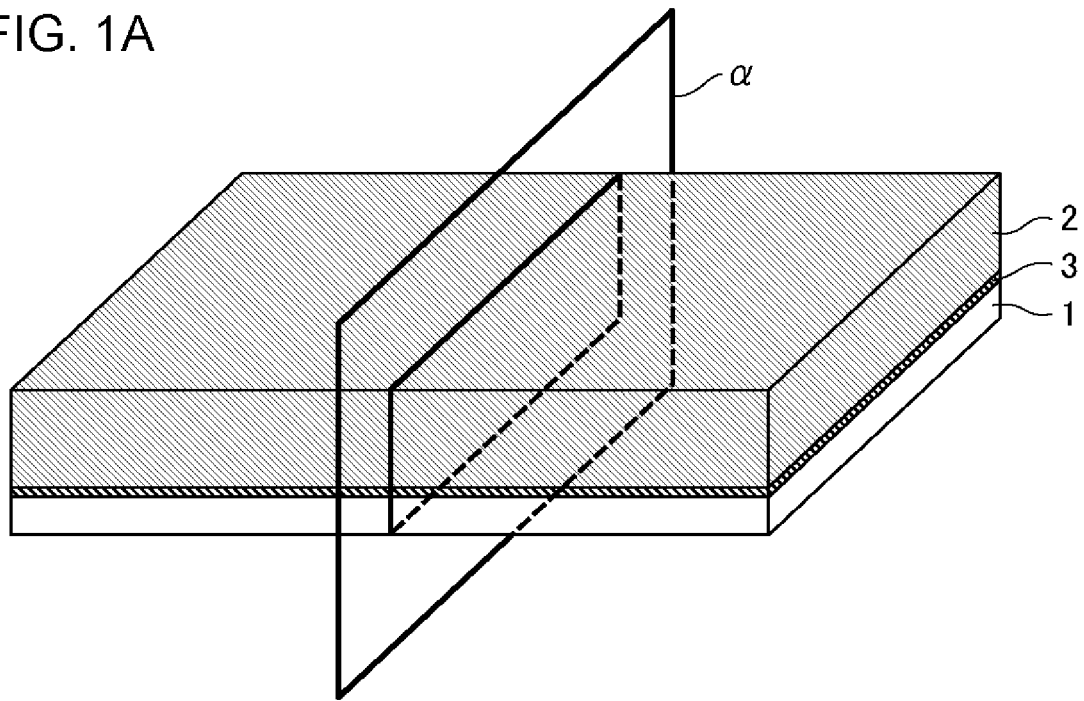
FIG. 1(A) is a diagram schematically illustrating the entire ceramic-copper composite.
Figure 1B:
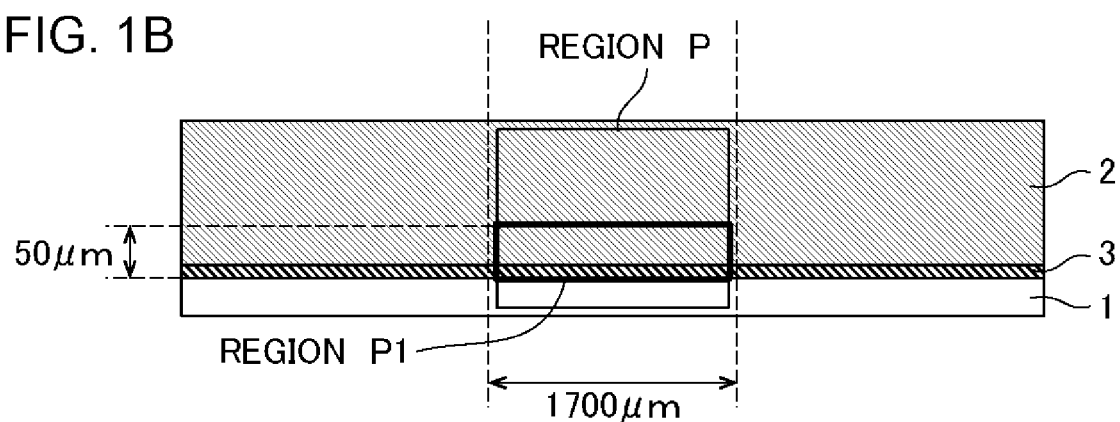
FIG. 1(B) is a diagram schematically illustrating a cross section of the ceramic-copper composite.
Figure 2:
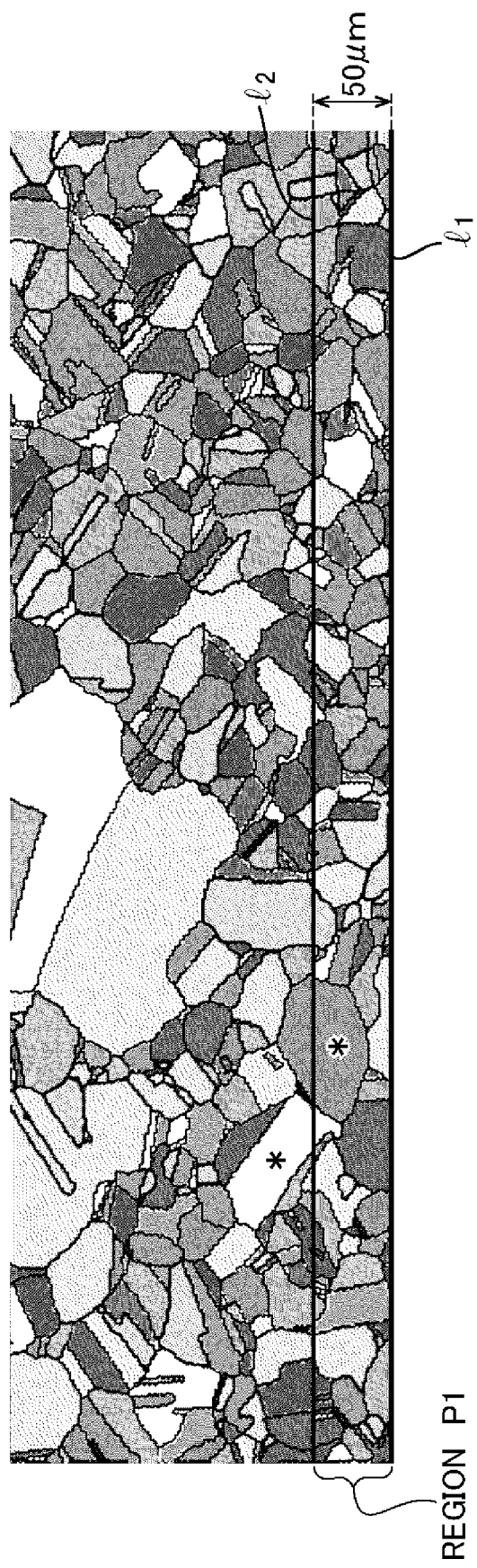
FIG. 2 is a supplementary view for illustrating "copper crystals at least partially present in a region P1" in the ceramic-copper composite of the present embodiment.

In order to avoid complexity, (i) in a case where there are a plurality of the same components in the same drawing, only one of the components is denoted by a reference sign, and all the components are not denoted by reference signs, or (ii) especially in FIG. 2 and subsequent drawings, the same components as those in FIG. 1 may not be denoted by reference signs again.

All drawings are for illustration purposes only. The shapes, dimensional ratios, and the like of each part in the drawings do not necessarily correspond to actual articles. In particular, vertical and horizontal dimensions of each part illustrated in the drawings may be exaggerated in a vertical or horizontal direction.

In the present specification, unless otherwise specified, the term "substantially" means to include a range in consideration of manufacturing tolerances, assembly variations, and the like.

In the following, the ceramic-copper composite is also simply referred to as "composite".

Ceramic-Copper Composite (Composite)

FIG. 1(A) is a diagram schematically illustrating a ceramic-copper composite (composite) of the present embodiment.

The composite has a flat plate shape.

The composite includes at least a ceramic layer 1, a copper layer 2, and a brazing material layer 3 present between these two layers. In other words, the ceramic layer 1 and the copper layer 2 are bonded by the brazing material layer 3.

FIG. 1(B) is a diagram schematically illustrating a cut surface of the ceramic-copper composite illustrated in FIG. 1(A) obtained when the ceramic-copper composite is cut at a plane a perpendicular to a main surface thereof (auxiliary lines and the like are added for explanation).

The cut surface a can be set so as to pass through the center of gravity of the flat plate-shaped composite, for example.

In the cut surface illustrated in FIG. 1(B), a region having a length of 1,700 μm in a long-side direction is a region P. The region P can be set at any place on the cut surface, but can be set, for example, at a place including the center of gravity of the composite before cutting.

In addition, based on an interface between the ceramic layer 1 and the brazing material layer 3 in the region P, a region within 50 μm on a side of the copper layer 2 from the interface is a region P1.

In this case, an average crystal grain size D1 of the copper crystals at least partially present in the region P1 is 30 μm or more and 100 μm or less, preferably 30 μm or more and 90 μm or less, and more preferably 30 μm or more and 80 μm or less.

The reason why such a composite suppresses occurrence of cracks even after a thermal cycle test under strict conditions can be explained as follows. It should be noted that the following description includes assumptions, and the following description is not within the scope of the present invention.

In the composite of the present embodiment, "an average crystal grain size D1 of the copper crystals at least partially present in the region P1 is 30 μm or more and 100 μm or less" means that the average crystal grain size of the copper crystals located in the vicinity of the ceramic layer 1 is relatively small.

As described above, stress caused by a difference in the coefficient of thermal expansion is generated at the bonding interface between the ceramic material and the metal plate. However, if the average crystal grain size of the copper crystals in the vicinity of the ceramic layer 1 in the copper layer 2 is relatively small as in the composite of the present embodiment, the stress can be relaxed or reduced by "grain boundary sliding".

Therefore, it is considered that cracks are less likely to occur even through the thermal cycle test under strict conditions.

In order to make the average crystal grain size D1 in the composite of the present embodiment 30 μm or more and 100 μm or less, it is important to select an appropriate material in the production of the composite and to appropriately adjust the production conditions. Particularly, it is important to select a material for forming the copper layer 2 in the present embodiment. Details thereof will be described later.

According to the findings of the present inventors, it is difficult to set the average crystal grain size D1 to 30 μm or more and 100 μm or less unless an appropriate copper material is selected.

Here, it should be noted that "copper crystals at least partially present in the region P1" is additionally described.

FIG. 2 is a schematic view illustrating an enlarged part of the region P and grain boundaries of copper contained in the region P. A solid line $l_1$ drawn at the bottom of FIG. 2 is an interface between the ceramic layer 1 and the brazing material layer 3. A region within 50 μm upward from the solid line $l_1$ (region sandwiched between the solid lines $l_2$ and $l_2$) is the region P1.

In FIG. 2, for example, a part of the copper crystals marked with "*" is contained in the region P1 and the other part thereof is not contained in the region P1.

In the present embodiment, the copper crystals marked with "*", that is, "the copper crystals partially (not all) present in the region P1" are also included to be subjected to measurement of the grain size, in addition to all copper crystals located in the region P1 (not protruding outside the region P1). Then, the average crystal grain size D1 is calculated based on the measurement result.

It should be noted that many of "the copper crystals partially present in the region P1" are illustrated in FIG. 2, in addition to the copper crystals marked with "*". That is, all the copper crystals through which the straight line $l_2$ passes are basically subjected to grain size measurement when calculating the average crystal grain size D1.

The composite of the present embodiment will be described continuously.

Additional Information on Grain Size of Copper Crystal in Region P1

As described above, when the "average crystal grain size D1" of the copper crystals at least partially present in the region P1 is 30 μm or more and 100 μm or less, cracks and the like can be reduced.

As such, a crack reduction effect can be further enhanced due to not only the appropriately small "average crystal grain size", but also the fact that the region P1 does not contain coarse copper crystals.

Specifically, the copper crystals at least partially present in the region P1 preferably do not contain crystals having a grain size of exceeding 350 μm, and more preferably do not contain crystals having a grain size of exceeding 300 μm.

As such, since the coarse copper particles are not contained, a portion where the grain boundary sliding is less likely to occur and the stress is less likely to be relaxed is reduced. Therefore, it is considered that cracks are less likely to occur even through the thermal cycle test under strict conditions.

It should be noted that in terms of stress reduction, basically, it is better as the grain size of the copper crystals in the region P or the region P1 is smaller.

A lower limit of the grain size of the copper crystals in the region P or region P1 is, for example, about 5 μm. In other words, it is preferable that copper crystals having a grain size which is the same as or equal to or smaller than a limit measured by an EBSD method to be described later are contained in the region P or the region P1.

Grain Size of Copper Crystal in Region P, And The Like

In addition to the average crystal grain size D1 of the copper crystals at least partially present in the region P1, it is preferable that an average crystal grain size D2 of the copper crystals in the entire region P is also an appropriate value.

For example, when the average crystal grain size of the copper crystals in the entire region P (that is, an average crystal grain size obtained when all the copper crystals contained in the region P is set as a target) is D2, a value of D2/D1 is preferably 0.5 or more and 2.0 or less, and more preferably 1.0 or more and 1.5 or less.

The value of D2/D1 being in the numerical range means that the average crystal grain size of the copper crystals contained in the region P and the average crystal grain size of the copper crystals at least partially present in the region P1 are the same. In other words, it can be said that "there is no deviation in average crystal grain size" in the entire copper layer 2. As a result, the uniform stress is easily absorbed in the entire copper layer 2, and it is thus considered that cracks can be further reduced. By the way, although the details thereof are unclear, heat cycle characteristics are even better when the value of D2/D1 is 1.0 or more and 1.5 or less (that is, D2 and D1 are almost equal or D2 is slightly larger).

For reference, the value of D2 itself can be, for example, about the same as D1, but is preferably 15 μm or more and 200 μm or less, and more preferably 30 μm or more and 150 μm or less.

'Continuous' Presence of Copper Particle Having Relatively Small Particle Size

Like the region P1, preferably, a region in which the average crystal grain size of the copper crystals in the vicinity of the ceramic layer 1 is relatively small is 'continuously', not locally, present in the copper layer 2. In other words, preferably, the average crystal grain size of the copper crystals is relatively small in anyplace in the vicinity of a bonding surface of the ceramic layer 1 and the copper layer 2.

As a result, the stress of the entire substrate can be sufficiently reduced, and more remarkable crack reduction effect can be obtained.

Further, the fact that the average crystal grain size of the copper crystals in the vicinity of the ceramic layer 1 in the copper layer 2 is relatively small means that a relatively large number of copper grain boundaries is present in the vicinity of the ceramic layer 1 in the copper layer 2. Then, it is considered that a bonding force between the ceramic layer 1 and the copper layer 2 becomes stronger due to the diffusion of the brazing material at the relatively large number of copper grain boundaries.

Specifically, a region having a length of 1,700 μm in the long-side direction is set as a region different from the region P (not overlapping the region P) on the cut surface illustrated in FIG. 1(B). When the region is a region P', an average crystal grain size D1' of the copper crystals at least partially present in a region P1' within 50 μm on the side of the copper layer 2 from the interface between the ceramic layer 1 and the brazing material layer 3 in the region P' is preferably 30 μm or more and 100 μm or less, more preferably 30 μm or more and 90 μm or less, and more preferably 30 μm or more and 80 μm or less.

Moreover, the copper crystals at least partially present in the region P1' preferably do not contain crystals having a grain size of exceeding 350 μm, and more preferably do not contain crystals having a grain size of exceeding 300 μm.

Material of Ceramic Layer 1

The material of the ceramic layer 1 is not particularly limited as long as it is a ceramic material.

Examples of the material of the ceramic layer 1 can include nitride-based ceramics such as silicon nitride and aluminum nitride, oxide-based ceramics such as aluminum oxide and zirconium oxide, carbide-based ceramics such as silicon carbide, and boride-based ceramics such as lanthanum hexaboride, and the like.

In terms of a bonding strength with the copper layer 2, non-oxide ceramics such as aluminum nitride and silicon nitride are preferable. Furthermore, silicon nitride is preferable in terms of an excellent mechanical strength and fracture toughness.

Material for Forming Copper Layer 2

Particularly, it is important to select a material for forming the copper layer 2 in producing the composite of the present embodiment. By appropriately selecting a material for forming the copper layer 2, a composite having the desired D1, D2, or D1' can be produced. If the material is inappropriately selected, it is difficult to produce a composite having the desired D1 or the like.

Specifically, the composite having the desired D1 or the like can be produced using an oxygen-free copper grain control material (abbreviation of OFCG; oxygen-free copper plate produced by Mitsubishi Shindoh Co., Ltd.) as a material for forming the copper layer 2.

According to the findings of the present inventors, when a normal oxygen-free copper plate (OFC material) is used, copper crystals in the copper plate are "grown" by heating (about 800° C.) when the ceramic plate and the copper plate are bonded with a brazing material, the copper crystals are coarsened (that is, D1 exceeds 100 μm).

On the other hand, although the detailed mechanism is unclear, some measures of the OFCG material (oxygen-free copper plate) have been taken to suppress the growth of copper crystals due to heating at the time of bonding with the brazing material, and thus the growth of copper crystals is suppressed. As a result, a composite having D1 of 30 μm or more and 100 μm or less can be obtained.

By the way, various "measures" to suppress the growth of copper crystals due to heating at the time of bonding with the brazing material can be considered. One of the measures is considered to use a rolled copper plate (OFC material rolled with a large pressure) as a material of the copper layer 2.

It is assumed by the present inventors that as a result of rolling, the copper crystals in the rolled copper plate are deformed or crystal orientations are changed, which leads to suppression in crystal growth.

For reference, the OFCG material (oxygen-free copper plate, produced by Mitsubishi Shindoh Co., Ltd.) is produced by a process including a rolling process according to the manufacturer.

Brazing Material for Forming Brazing Material Layer 3

In terms of improving heat resistance cycle characteristics, the brazing material layer 3 is preferably formed of a brazing material containing Ag, Cu and Ti, and Sn and/or In. The use of the brazing material with an appropriate composition is also important in terms of controlling the values such as D1, D2, and D1'.

By increasing a blending ratio of Ag powder from 72% by mass:28% by mass, which is an eutectic composition of Ag and Cu, with a Ag/Cu ratio in blending the brazing material, coarsening of a Cu-rich phase can be prevented and a brazing material layer structure in which Ag-rich phases are continuous can be formed.

In addition, if a blending amount of the Ag powder is large and a blending amount of Cu powder is small, the Ag powder may not be completely dissolved at the time of bonding and may remain as bonding voids. Therefore, in the blending ratio of the Ag powder, the Cu powder, and the Sn powder or In powder, the Ag powder, the Cu powder, and the Sn powder or In powder are preferably in amounts of 85.0 parts by mass or more and 95.0 parts by mass or less, 5.0 parts by mass or more and 13.0 parts by mass or less, and 0.4 parts by mass or more and 3.5 parts by mass or less, respectively.

Ag powder having a specific surface area of 0.1 $m^2/g$ or more and 0.5 $m^2/g$ or less may be used as the Ag powder. By using the Ag powder having an appropriate specific surface area, it is possible to sufficiently suppress aggregation of the powder, bonding defects, formation of bonding voids, or the like. A gas adsorption method can be applied to measurement of the specific surface area.

The Ag powder is generally produced by an atomizing method, a wet reduction method, or the like.

As the Cu powder, Cu powder having a specific surface area of 0.1 $m^2/g$ or more and 1.0 $m^2/g$ or less and a median size D50 of 0.8 μm or more and 8.0 μm or less in a particle size distribution on a volume basis measured by a laser diffraction method, may be used, in order to make the Ag-rich phases continuous. By using the Cu powder with the appropriate specific surface area or grain size, it is possible to suppress the bonding defects and suppress the Ag-rich phases from being discontinuous due to the Cu-rich phase.

Sn or In contained in the brazing material powder is a component for reducing a contact angle of the brazing material with respect to the ceramic plate and improving wettability of the brazing material. The blending amount thereof is preferably 0.4 parts by mass or more and 3.5 parts by mass or less.

By appropriately adjusting the blending amount, the wettability to the ceramic plate can be made appropriate and the possibility of bonding defects can be reduced. In addition, the Ag-rich phases in the brazing material layer 3 are discontinuous due to the Cu-rich phase, which results from cracking of the brazing material, and the possibility of reduction in thermal cycle characteristics can thus be reduced.

As the Sn powder or In powder, powder having a specific surface area of 0.1 m$^2$/g or more and 1.0 m$^2$/g or less and D50 of 0.8 μm or more and 10.0 μm or less may be used.

By using powder with the appropriate specific surface area or grain size, it is possible to reduce the possibility of bonding defects or the possibility of occurrence of bonding voids.

The brazing material preferably contains an active metal in terms of enhancing reactivity with an aluminum nitride substrate or a silicon nitride substrate. Specifically, it is preferable to contain titanium because it can have high reactivity with the aluminum nitride substrate or the silicon nitride substrate and a very high bonding strength.

An addition amount of the active metal such as titanium is preferably 1.5 parts by mass or more and 5.0 parts by mass or less, with respect to the total 100 parts by mass of the Ag powder, the Cu powder, and the Sn powder or the In powder. By appropriately adjusting the addition amount of the active metal, the wettability to the ceramic plate can be further enhanced, and the occurrence of bonding defects can be further suppressed. In addition, the unreacted active metal can be suppressed to remain, and discontinuity of the Ag-rich phases can also be suppressed.

The brazing material can be obtained by mixing at least the above-described metal powder with an organic solvent or a binder, if necessary. For mixing, an automated mortar, a revolving mixer, a planetary mixer, a triple roller, or the like can be used. As a result, a paste-like brazing material can be obtained, for example.

The organic solvent that is available here is not particularly limited. Examples of the organic solvent can include methyl cellosolve, ethyl cellosolve, isophorone, toluene, ethyl acetate, telepineol, diethylene glycol/monobutyl ether, and texanol.

The binder that is available here is not particularly limited. Examples of the binder can include a polymer compound such as polyisobutyl methacrylate, ethyl cellulose, methyl cellulose, an acrylic resin, and a methacrylic resin.

Thickness of Each Layer (Average Thickness)

A thickness of the ceramic layer 1 is typically 0.1 mm or more and 3.0 mm or less. Considering heat radiation characteristics of the entire substrate and the reduction in thermal resistance, the thickness of the ceramic layer 1 is preferably 0.2 mm or more and 1.2 mm or less, and more preferably 0.25 mm or more and 1.0 mm or less.

A thickness of the copper layer 2 is typically 0.1 mm or more and 1.5 mm or less. In terms of a heat radiation property, the thickness of the copper layer 2 is preferably 0.3 mm or more, and more preferably 0.5 mm or more.

A thickness of the brazing material layer 3 is not particularly limited as long as the ceramic layer 1 and the copper layer 2 can be bonded. The thickness of the brazing material layer 3 is typically 3 μm or more and 40 μm or less, preferably 4 μm or more and 25 μm or less, and more preferably 5 μm or more and 15 μm or less.

[Additional Layers, And The Like]

The composite of the present embodiment may include additional layers other than the above-described three layers. For example, the composite of the present embodiment may have a five-layered structure in which the ceramic layer 1 is used as a center layer and copper layers 2 are provided on both surfaces of the ceramic layer 1 through brazing material layers 3.

In a case of the above five-layered structure, it is preferable that D1, D2/D1, D1', or the like is in the above-described numerical range on at least one surface of the ceramic layer 1.

However, it is more preferable that D1, D2/D1, D1', or the like is in the above numerical range on both surfaces of the ceramic layer 1, in terms of further reduction in cracks, stress generation in the entire composite, and reduction in deformation, warpage, or the like.

That is, in the above-mentioned five-layered composite, there are "two" interfaces between the ceramic layer 1 and the brazing material layer 3:

(i) A region P1 which is set from one interface (first interface) of the two interfaces to a side of the copper layer 2 closer to the first interface, and (ii) Another region P1 which is set from the other interface (second interface) of the two interfaces to the side of the copper layer 2 closer to the second interface.

In the both the two regions P1, it is more preferable that D1, D2/D1, D1', or the like is in the above-described numerical range on both sides of the two regions P1.

Shape, Size, And The Like of Composite

As described above, the composite of the present embodiment has a flat plate shape.

Typically, the composite of the present embodiment has a substantially rectangular shape having a size of about 10 mm×10 mm to 200 mm×200 mm.

It should be noted that the composite of the present embodiment typically has a size which can define the above-described "region P having a length of 1,700 μm" and "region P' of having a length 1,700 μm".

Cutting of Composite, Measurement/Analysis of Copper Crystal, And The Like

A method of measuring a grain size of the copper crystals in the "cross section" of the composite of the present embodiment will be described.

First, for example, a "cross section" for measuring a grain size of the copper crystal is obtained as follows.

(1) The composite (or ceramic circuit board to be described later) is cut, by a contour machine, at a cross section perpendicular to the main surface and passing through the center of gravity of the composite, to expose the cross section of the composite.

(2) The cut composite is embedded in a resin to prepare a resin-embedded body.

(3) Buff polishing is performed on the cross section of the composite in the prepared resin-embedded body with diamond abrasive grains.

Then, for the above polished cross section of the composite, D1, D2, D1', or the like can be obtained by acquiring data on particles/grain boundaries/crystal orientation, and the like of the copper crystal by an electron backscatter diffraction method and analyzing the data (The electron backscatter diffraction method is also called an EBSD method, which is an acronym for Electron Backscattering Diffraction).

Figure 3:
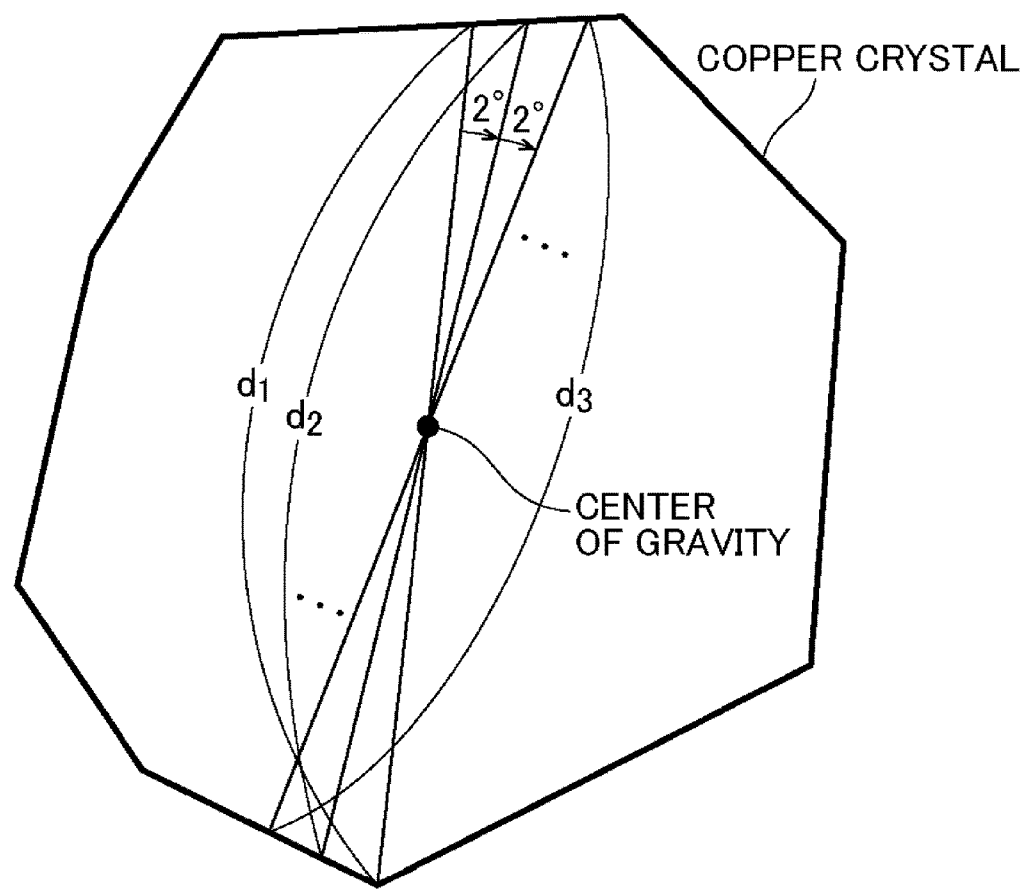
FIG. 3 is a supplementary view for illustrating a method of obtaining a particle size of a copper crystal particle.

In the present specification, a particle size for each particle of the copper crystal (particle size of each particle based on calculation of "average" particle size of D1 or D2)

is obtained as follows. See also FIG. 3 for obtaining the particle size for each particle of the copper crystal.

(1) A straight line L passing through the geometric center of gravity of one particle (referred to as particle A) seen in the above cross section is drawn. A distance $d_1$ between two points where the straight line intersects the grain boundary of the particle A is measured.

(2) The straight line L is rotated by 2° around the geometric center of gravity of the particle A. A distance $d_2$ between two points where the rotated straight line intersects the grain boundary of the particle A is measured.

(3) The operation of the (2) is repeated until the straight line L is rotated by 180° to measure distances $d_3$, $d_4$, . . . between two points where the straight line intersects the grain boundary of the particle A.

(4) An average of the obtained $d_1$, $d_2$, $d_3$, $d_4$ . . . is a particle size of the particle A.

Method of Producing Composite And Formation of Circuit

The composite of the present embodiment can be produced by, for example, the following steps.

(1) A brazing material paste is applied to one or both surfaces of the ceramic plate to bring the copper plate into contact with the applied surface.

(2) The ceramic plate and the copper plate are bonded by a heat treatment in a vacuum or inert atmosphere.

The method of applying the brazing material paste to the ceramic plate in the (1) is not particularly limited. Examples of the method of applying the brazing material paste can include a roll coater method, a screen printing method, a transfer method, and the like. The screen printing method is preferable because it is easy to uniformly apply the brazing material paste.

In order to uniformly apply the brazing material paste by the screen printing method, a viscosity of the brazing material paste is preferably controlled to 5 Pa·s or more and 20 Pa·s or less. In addition, an amount of the organic solvent in the brazing material paste is adjusted to 5% by mass or more and 17% by mass or less and an amount of the binder is adjusted to 2% by mass or more and 8% by mass or less, such that printability can be enhanced.

A treatment of the bonding of the ceramic plate and the copper plate in the (2) is preferably performed in vacuum or inert atmosphere such as nitrogen or argon at a temperature of 770° C. or higher and 830° C. or lower for 10 minutes or longer and 60 minutes.

When the temperature is 770° C. or higher and/or the treatment time is 10 minutes or longer, an amount of copper dissolved from the copper plate can be sufficiently increased and bondability of the ceramic plate and the copper plate can be sufficiently strengthened.

On the other hand, when the temperature is 830° C. or lower and/or the treatment time is 60 minutes or shorter, merits, such as maintenance of continuity of the Ag-rich phases in the brazing material layer, suppression of diffusion of excessive brazing material into the copper plate, suppression of coarsening of the copper crystal due to recrystallization of copper, and reduction in stress resulting from a difference in coefficient of thermal expansion between ceramic and copper, can be obtained.

The composite (including the ceramic layer 1, the copper layer 2, and the brazing material layer 3 present between these two layers) of the present embodiment can be obtained by the steps like the (1) and the (2).

Ceramic Circuit Board

The composite thus obtained may be further treated/processed.

For example, at least a part of the copper layer 2 of the composite may be removed to form a circuit. More specifically, a circuit pattern may be formed by removing a part of the copper layer 2 or the brazing material layer 3 by etching. As a result, a ceramic circuit board can be obtained.

A procedure for forming the circuit pattern on the composite to obtain a ceramic circuit board will be described below.

Formation of Etching Mask

First, an etching mask is formed on a surface of the copper layer 2.

As a method of forming the etching mask, a known techniques, such as a photographic development method (photoresist method), a screen printing method, or an inkjet printing method using PER400K ink (produced by Goo Chemical Co., Ltd.), can be appropriately adopted.

Etching Treatment of Copper Layer 2

In order to form the circuit pattern, an etching treatment is performed on the copper layer 2.

There is no particular limitation on an etching solution. As the etching solution generally used, a ferric chloride solution, a cupric chloride solution, a sulfuric acid, a hydrogen peroxide solution, or the like can be used. Preferred examples thereof can include a ferric chloride solution or a cupric chloride solution. Aside surface of a copper circuit may be tilted by adjusting an etching time.

Etching Treatment of Brazing Material Layer 3

The applied brazing material, an alloy layer thereof, a nitride layer, and the like remain in the composite from which a part of the copper layer 2 is removed by etching. Therefore, it is common to remove the applied brazing material, the alloy layer thereof, the nitride layer, and the like by using a solution containing an aqueous solution of ammonium halide, inorganic acids such as a sulfuric acid and a nitric acid, and a hydrogen peroxide solution. By adjusting conditions such as an etching time, a temperature, and a spray pressure, a length and a thickness of the protruding portion of the brazing material can be adjusted.

Peeling of Etching Mask

A method of peeling the etching mask after the etching treatment is not particularly limited. A method of immersing the etching mask in an alkaline aqueous solution is generally used.

Plating/Rustproofing Treatment

In terms of improving durability, suppressing changes over time, or the like, a plating treatment or a rustproofing treatment may be performed.

Examples of the plating can include Ni plating, Ni alloy plating, Au plating, and the like. A specific method of plating can be performed by, for example, (i) a normal electroless plating method of using a liquid chemical containing a hypophosphorous acid salt as a Ni—P electroless plating liquid after degreasing, chemical polishing, and a pretreatment step with a liquid chemical for Pd activation, and (ii) a method of electroplating by bringing an electrode into contact with a copper circuit pattern.

The rustproofing treatment can be performed by, for example, a benzotriazole-based compound.

Power Module

For example, an appropriate semiconductor element is disposed on the copper circuit of the ceramic circuit board on which the copper circuit is formed as described above. In this way, a power module on which the ceramic circuit board is mounted can be obtained.

For specific configurations and details of the power module, see, for example, Patent Documents 1 to 3 described above, Japanese Unexamined Patent Publication No. 10-223809, Japanese Unexamined Patent Publication No. 10-214915, and the like.

Although the embodiments of the present invention have been described above, these are mere examples of the present invention, and various other configurations other than those given above may be adopted. Further, the present invention is not limited to the above-described embodiments, and modifications, improvements, and the like within the range in which the object of the present invention can be achieved are included in the present invention.

EXAMPLE

Embodiments of the present invention will be described in detail based on Examples and Comparative Examples. The present invention is not limited to Examples.

Production of Ceramic-Copper Composite

Example 1

As a brazing material (containing active metal), a brazing material containing 3.5 parts by mass of titanium hydride powder (TCH-100, produced by TOHO TECHNICAL SERVICE) was prepared with respect to a total 100 parts by mass of 89.5 parts by mass of Ag powder (Ag-HWQ, 2.5 μm, produced by FUKUDA METAL FOIL & POWDER CO., LTD.), 9.5 parts by mass of Cu powder (Cu-HWQ, 3 μm, produced by FUKUDA METAL FOIL & POWDER CO., LTD.), and 1.0 part by mass of Sn powder (Sn-HPN, 3 μm, produced by FUKUDA METAL FOIL & POWDER CO., LTD.).

The brazing material, a binder resin PIBMA (polyisobutyl methacrylate, "DIANAL" produced by Mitsubishi Chemical Corporation) and a tarpineol solvent were mixed to obtain a brazing material paste.

The brazing material paste was applied to both surface of a silicon nitride substrate by a screen printing method so that a dry thickness on each surface was about 10 μm. As the silicon nitride substrate, a substrate (manufactured by Denka Company Limited) having a thickness of 0.32 mm and a size of 45 mm in length×45 mm in width was used.

Thereafter, copper plates (specifically, shown in Table 1 below) are laminated on both surfaces of the silicon nitride substrate, and heated in vacuum of $1.0 \times 10^{-3}$ Pa or less at 780° C. for 30 minutes, and bonded the silicon nitride substrate and the copper plate with the brazing material. As a result, a ceramic-copper composite in which the silicon nitride substrate and the copper plate were bonded with the brazing material was obtained.

An etching resist was printed on the bonded copper plate and etched with a ferric chloride solution to form a circuit pattern. Further, the brazing material layer and the nitride layer were removed with an ammonium fluoride/hydrogen peroxide solution. In a plating step, the rustproofing treatment was performed with the benzotriazole-based compound through the pretreatment step by degreasing and chemical polishing.

As a result, a circuit from which a part of the copper layer of the ceramic-copper composite is removed was formed to obtain a ceramic circuit board.

Examples 2 to 10 And Comparative Examples 1 to 10

The silicon nitride substrate and the copper plate were bonded with the brazing material in the same manner as in Example 1, except for metal components of the brazing material as shown in Table 1 below as the copper plate shown in Table 1, and bonding conditions as shown in Table 1. Then, the etching treatment or the like was performed to obtain a ceramic circuit board.

TABLE 1

| | | Metal component of brazing material | | | | | Bonding condition | |
|---|---|---|---|---|---|---|---|---|
| | | Ag | Cu | Sn | In | TiH$_2$ | | |
| Example/Comparative Example No. | Cooper plate | (part by mass) | (part by mass) | (part by mass) | (part by mass) | (part by mass) | Bonding temperature (° C.) | Retention time (minute) |
| Example 1 | Copper plate 1 | 89.5 | 9.5 | 1.0 | — | 3.5 | 780 | 30 |
| Example 2 | Copper plate 1 | 89.5 | 9.5 | 1.0 | — | 3.5 | 830 | 50 |
| Example 3 | Copper plate 1 | 93.0 | 5.5 | 1.5 | — | 3.5 | 810 | 40 |
| Example 4 | Copper plate 1 | 89.0 | 9.0 | 2.0 | — | 3.5 | 800 | 300 |
| Example 5 | Copper plate 1 | 85.0 | 13.0 | 2.0 | — | 3.5 | 800 | 30 |
| Example 6 | Copper plate 1 | 88.0 | 8.5 | 3.5 | — | 3.5 | 775 | 30 |
| Example 7 | Copper plate 1 | 89.5 | 9.5 | — | 1.0 | 3.5 | 780 | 30 |
| Example 8 | Copper plate 1 | 88.5 | 8.5 | — | 3.0 | 3.5 | 775 | 40 |
| Example 9 | Copper plate 1 | 89.5 | 9.5 | — | 1.0 | 3.5 | 830 | 50 |
| Example 10 | Copper plate 1 | 85.0 | 13.0 | — | 2.0 | 3.5 | 800 | 30 |
| Comparative Example 1 | Copper plate 2 | 89.5 | 9.5 | 1.0 | — | 3.5 | 780 | 30 |
| Comparative Example 2 | Copper plate 2 | 90.0 | 10.0 | — | — | 3.5 | 780 | 30 |
| Comparative Example 3 | Copper plate 2 | 88.9 | 10.0 | 0.1 | — | 3.5 | 810 | 30 |
| Comparative Example 4 | Copper plate 2 | 87.5 | 7.5 | 5.0 | — | 3.5 | 790 | 20 |

TABLE 1-continued

| | | Metal component of brazing material | | | | | Bonding condition | |
|---|---|---|---|---|---|---|---|---|
| | | Ag | Cu | Sn | In | TiH$_2$ | | |
| Example/Comparative Example No. | Cooper plate | (part by mass) | (part by mass) | (part by mass) | (part by mass) | (part by mass) | Bonding temperature (° C.) | Retention time (minute) |
| Comparative Example 5 | Copper plate 2 | 87.5 | 7.5 | — | 5.0 | 3.5 | 790 | 40 |
| Comparative Example 6 | Copper plate 2 | 88.9 | 10.0 | — | 0.1 | 3.5 | 810 | 30 |
| Comparative Example 7 | Copper plate 2 | 89.5 | 9.5 | 1.0 | — | 7.0 | 820 | 45 |
| Comparative Example 8 | Copper plate 2 | 89.5 | 9.5 | 1.0 | — | 3.5 | 840 | 90 |

In Table 1, a copper plate 1 and a copper plate 2 are as follows. The grain size of the copper crystals in all the copper plates was about 20 μm.
  Copper plate 1: an oxygen-free copper grain control material (abbreviation of OFCG; oxygen-free copper plate, produced by Mitsubishi Shindoh Co., Ltd.), a rolled copper plate having a thickness of 0.8 mm
  Copperplate 2: an oxygen-free copperplate oxygen-free copper material (abbreviation of OFC; oxygen-free copper plate, produced by Mitsubishi Shindoh Co., Ltd.), a thickness of 0.8 mm
In Table 1, for the copper plates containing In as a metal component of the brazing material, the In powder (atomization process special grade reagent) was used as a raw material.

Ceramic-Copper Composite Cutting, EBSD Measurement, Calculation of Copper Crystal Grain Size in Region P, and the Like First, a "cross section" for measurement was obtained by the following procedure.
(1) The ceramic circuit board obtained in respective Examples and Comparative Examples was cut at a cross section perpendicular to the main surface and passing through the center of gravity of the substrate (approximately the center of the silicon nitride substrate having 45 mm in length and 45 mm in width). A contour machine was used for cutting.
(2) The cut ceramic circuit board was embedded in a resin to prepare a resin-embedded body.
(3) Buff polishing was performed on the cross section of the composite in the prepared resin-embedded body with diamond abrasive grains.

The polished cross section of the substrate was measured by the electron backscatter diffraction method.

Specifically, first, the region P of 1,700 mm in the longitudinal direction of the cross section was set in the vicinity of approximately the center of the polished cross section of the substrate. The copper layer in the region P was analyzed by an electron backscatter diffraction (EBSD) method under a condition of an acceleration voltage of 15 kV to acquire data. A SU6600 type field-emission scanning electron microscopy (manufactured by Hitachi High-Tech Corporation) and an analyzer (manufactured by TSL Solutions) were used for the EBSD method.

The measurement data was visualized by software (OIM Data Analysis 7.3.0, manufactured by TSL Solutions) to create a crystal orientation map. By analyzing the crystal orientation map using image processing software, the average crystal grain size D2 of the copper crystal in the entire region P was obtained.

Moreover, based on the interface between the ceramic layer and the brazing material layer in the region P by the analysis with the same image processing software, the average crystal grain size D1 of the copper crystals at least partially present in the region P1 within 50 μm on a side of the brazing material layer from the interface was also obtained.

In the above, Image-Pro Plus Shape Stack version 6.3 (manufactured by Media Cybernetics, Inc.) was used as the image processing software. As described above, the grain size of each crystal was obtained by drawing the straight line L passing through the geometric center of gravity of the visualized particles. Then, the obtained plurality of grain sizes were averaged to obtain D1 or D2 (calculate a value automatically processed by software).

Furthermore, it was determined from information on the crystal orientation map whether or not the copper crystals at least partially present in the region P1 contain crystals having a grain size of exceeding 350 μm.

Grain Size of Copper Crystal in Region P', and the Like

In the cross section of the ceramic circuit board, a region P' having a length of 1,700 μm in the long-side direction of the cross section was set as a region different from the region P (not overlapping with the region P).

In the region P', the same measurement and analysis as described above were performed to obtain an average crystal grain size D1' of the copper crystals at least partially present in the region P1'. Table 2 below showed whether D1' is in a range of 30 μm or more and 100 μm or less (a case where D1' "is in a range of" 30 μm or more and 100 μm or less was defined as A, and a case where D1' "is not in the range of" 30 μm or more and 100 μm or less was defined as B).

Further, it was determined whether or not the copper crystals a least partially present in the region P1' contain the crystals having a grain size of exceeding 350 μm.

Thermal Cycle Test And Crack Evaluation

A thermal cycle test in which 3,000 thermal cycles are repeated by setting the thermal cycles "at −55° C. for 15 minutes, at 25° C. for 15 minutes, at 175° C. for 15 minutes, and at 25° C. for 15 minutes" as one cycle was performed on the ceramic circuit board of respective Examples and Comparative Examples.

After the test, the copper plate and the brazing material layer were peeled off by etching with iron chloride and ammonium fluoride/hydrogen peroxide to expose the silicon nitride substrate. Then, the entire silicon nitride substrate was captured by a scanner at a resolution of 600 dpi×600 dpi, and binarized by image analysis software GIMP2

(threshold value 140). Based on the binarization data, an area of cracks in a horizontal direction of the silicon nitride substrate was calculated, and a value of the area of cracks was divided by an area of copper before removal and multiplied by 100 to obtain a "horizontal crack ratio" (area %).

The crack ratio of 0.0 to 2.0% were defined as A (good), and the crack ratio of exceeding 2.0% was defined as B (poor).

Table 2 shows summary of analysis results such as particle size and crack evaluation results.

obtaining the ceramic-copper composite/ceramic circuit board of the present embodiment.

In addition, it is understood that by making the average crystal grain size of the copper crystals in the vicinity of the ceramic layer in the copper layer relatively small, the stress due to the thermal cycle (due to "grain boundary sliding") is relaxed and reduced, and the occurrence of horizontal cracks is thus reduced.

Priority is claimed on Japanese Patent Application No. 2018-218964, filed Nov. 22, 2018, the content of which is incorporated herein by reference.

TABLE 2

| Example/ Comparative Example No. | Average crystal grain size D1 (μm) of copper crystals at least partially present in region P1 | Average crystal grain size D2 (μm) of copper crystals in entire region P | D2/D1 | Whether or not crystals at least partially present in region P1 contain crystals having grain size of exceeding 350 μm | Whether or not average crystal grain size D1' of copper crystals at least partially present in region P1' is 30 μm or more and 100 μm or less | Whether or not copper crystals at least partially present in region P1' contain crystals having grain size of exceeding 350 μm | Horizontal crack ratio (area %) | Evaluation of horizontal crack ratio |
|---|---|---|---|---|---|---|---|---|
| Example 1 | 68 | 73 | 1.1 | Not contained | A | Not contained | 0.3 | A |
| Example 2 | 90 | 85 | 0.9 | Not contained | A | Not contained | 1.5 | A |
| Example 3 | 70 | 45 | 0.6 | Not contained | A | Not contained | 0.8 | A |
| Example 4 | 90 | 65 | 0.7 | Not contained | A | Not contained | 1.0 | A |
| Example 5 | 80 | 84 | 1.1 | Not contained | A | Not contained | 1.5 | A |
| Example 6 | 65 | 78 | 1.2 | Not contained | A | Not contained | 0.9 | A |
| Example 7 | 63 | 95 | 1.5 | Not contained | A | Not contained | 0.6 | A |
| Example 8 | 68 | 52 | 0.8 | Not contained | A | Not contained | 0.9 | A |
| Example 9 | 90 | 88 | 1.0 | Not contained | A | Not contained | 1.7 | A |
| Example 10 | 75 | 62 | 0.8 | Not contained | A | Not contained | 1.5 | A |
| Comparative Example 1 | 131 | 110 | 0.8 | Contained | B | Contained | 3.5 | B |
| Comparative Example 2 | 150 | 132 | 0.9 | Contained | B | Contained | 2.5 | B |
| Comparative Example 3 | 130 | 117 | 0.9 | Contained | B | Contained | 3.1 | B |
| Comparative Example 4 | 145 | 134 | 0.9 | Contained | B | Contained | 2.8 | B |
| Comparative Example 5 | 142 | 127 | 0.9 | Contained | B | Contained | 3.4 | B |
| Comparative Example 6 | 130 | 111 | 0.9 | Contained | B | Contained | 2.5 | B |
| Comparative Example 7 | 150 | 139 | 0.9 | Contained | B | Contained | 5.2 | B |
| Comparative Example 8 | 160 | 125 | 0.8 | Contained | B | Contained | 4.6 | B |

As shown in Table 2, the average crystal grain size D1 of the copper crystals at least partially present in the region P1 was in a range of 30 μm or more and 100 μm or less in the ceramic-copper composite (to be precise, the ceramic circuit board obtained by etching the composite) of Examples 1 to 10 produced by using the OFCG material (oxygen-free copper plate, produced by Mitsubishi Shindoh Co., Ltd.) as a material of the copper layer.

Therefore, the occurrence of horizontal cracks was suppressed even after the thermal cycle test with the strict conditions.

On the other hand, the average crystal grain size D1 of the copper crystals at least partially present in the region P1 was in a range of exceeding 100 μm in the ceramic-copper composite (to be precise, the ceramic circuit board obtained by etching the composite) of Comparative Examples 1 to 8 produced by using the oxygen-free plate OFC material (oxygen-free copper plate, produced by Mitsubishi Shindoh Co., Ltd.) as a material of the copper layer.

Therefore, it was more clearly observed in the thermal cycle test that more horizontal cracks occurred than in Examples 1 to 10.

From the above, it is understood that the selection of the material constituting the copper layer is important for

The invention claimed is:

1. A ceramic-copper composite having a flat plate shape, comprising:
    a ceramic layer;
    a copper layer; and
    a brazing material layer present between the ceramic layer and the copper layer,
    wherein when a region having a length of 1,700 μm in a long-side direction is a region P on a cut surface of the ceramic-copper composite obtained when the ceramic-copper composite is cut at a plane perpendicular to a main surface of the ceramic-copper composite, and a region within 50 μm on a side of the copper layer from an interface between the ceramic layer and the brazing material layer in the region P is a region P1, an average crystal grain size D1 of copper crystals of the region P1, calculated based on (1) the crystal grain size of copper crystals that are located entirely within the region P1 together with (2) the crystal grain size of copper crystals located partially within the region P1 and partially outside of the region P1, is 30 μm or more and 100 μm or less.

2. The ceramic-copper composite according to claim 1, wherein when an average crystal grain size of copper crystals in the entire region P is D2, a value of D2/D1 is 0.5 or more and 2.0 or less.

3. The ceramic-copper composite according to claim 1, wherein copper crystals having a crystal grain size of exceeding 350 μm are not present in the region P1.

4. The ceramic-copper composite according to claim 1, wherein when a region having a length of 1,700 μm in a long-side direction and different from the region P in the cut surface is a region P', and a region within 50 μm on a side of the copper layer from the interface between the ceramic layer and the brazing material layer in the region P' is a region P1', an average crystal grain size D1' of copper crystals of the region P1', calculated based on (1) the crystal grain size of copper crystals that are located entirely within the region P1' together with (2) the crystal grain size of copper crystals located partially within the region P1' and partially outside of the region P1', is 30 μm or more and 100 μm or less.

5. The ceramic-copper composite according to claim 4, wherein copper crystals having a crystal grain size exceeding 350 μm are not present in the region P1'.

6. The ceramic-copper composite according to claim 1, wherein the copper layer is formed of a rolled copper plate.

7. The ceramic-copper composite according to claim 1, wherein the brazing material layer includes Ag, Cu and Ti, and Sn and/or In.

8. A method of producing the ceramic-copper composite according to claim 1, the method comprising:
bonding a ceramic plate and a copper plate with a brazing material by heating at a temperature of 770° C. or higher and 830° C. or lower for 10 minutes or longer and 60 minutes or shorter in vacuum or inert gas atmosphere,
wherein the brazing material includes 85.0 parts by mass or more and 95.0 parts by mass or less of Ag, 5.0 parts by mass or more and 13.0 parts by mass or less of Cu, 1.5 parts by mass or more and 5.0 parts by mass or less of Ti, and 0.4 parts by mass or more and 3.5 parts by mass or less of a total amount of Sn and In.

9. A ceramic circuit board in which a circuit of the ceramic-copper composite according to claim 1 from which at least a part of the copper layer is removed is formed.

10. A power module on which the ceramic circuit board according to claim 9 is mounted.

* * * * *